United States Patent
Rajoo et al.

(10) Patent No.: US 9,406,577 B2
(45) Date of Patent: Aug. 2, 2016

(54) WAFER STACK PROTECTION SEAL

(71) Applicant: GLOBAL FOUNDRIES Singapore Pte. Ltd., Singapore (SG)

(72) Inventors: Ranjan Rajoo, Sangapore (SG); Kai Chong Chan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/201,935

(22) Filed: Mar. 10, 2014

(65) Prior Publication Data

US 2014/0264762 A1 Sep. 18, 2014

Related U.S. Application Data

(60) Provisional application No. 61/778,465, filed on Mar. 13, 2013.

(51) Int. Cl.
*H01L 23/10* (2006.01)
*B81C 3/00* (2006.01)
(Continued)

(52) U.S. Cl.
CPC .............. *H01L 23/10* (2013.01); *B81C 3/001* (2013.01); *H01L 21/50* (2013.01); *H01L 21/6835* (2013.01); *H01L 24/29* (2013.01); *H01L 24/30* (2013.01); *H01L 24/92* (2013.01); *H01L 24/94* (2013.01); *H01L 24/03* (2013.01); *H01L 24/05* (2013.01); *H01L 24/11* (2013.01); *H01L 24/13* (2013.01); *H01L 24/27* (2013.01); *H01L 24/83* (2013.01); *H01L 2221/68327* (2013.01); *H01L 2224/03002* (2013.01); *H01L 2224/04042* (2013.01); *H01L 2224/131* (2013.01); *H01L 2224/2732* (2013.01); *H01L 2224/2741* (2013.01); *H01L 2224/2745* (2013.01); *H01L 2224/2761* (2013.01); *H01L 2224/27462* (2013.01); *H01L 2224/27464* (2013.01); *H01L 2224/27618* (2013.01); *H01L 2224/29011* (2013.01); *H01L 2224/29014* (2013.01); *H01L 2224/2919* (2013.01); *H01L 2224/29078* (2013.01); *H01L 2224/29111* (2013.01); *H01L 2224/29124* (2013.01);
(Continued)

(58) Field of Classification Search
CPC ......... H01L 24/94; H01L 24/93; H01L 24/92; H01L 24/03; H01L 24/05; H01L 2224/94; H01L 2224/8385; H01L 2224/30505; H01L 2224/83; H01L 2224/1319; H01L 2224/01; H01L 23/10
USPC ................................. 438/455, 458, 107, 109
See application file for complete search history.

(56) References Cited

U.S. PATENT DOCUMENTS 7,067,397 B1 * 6/2006 Chang-Chien ........ B81B 7/0064
438/106
7,528,481 B2 * 5/2009 Kim .................... B81C 1/00301
257/704
(Continued)

*Primary Examiner* — Michael Trinh
(74) *Attorney, Agent, or Firm* — Horizon IP Pte. Ltd.

(57) ABSTRACT

A semiconductor wafer stack and a method of forming a semiconductor device is disclosed. The method includes providing first and second wafers with top and bottom surfaces. The wafers include edge and non-edge regions, and the first wafer includes devices formed in the non-edge region. A first protection seal may be formed at the edge region of the first wafer. The first and second wafers may further be bonded to form a device stack. The protection seal in the device stack contacts the first and second wafers to form a seal, and protects the devices in subsequent processing.

20 Claims, 10 Drawing Sheets

(51) Int. Cl.
H01L 21/50 (2006.01)
H01L 21/683 (2006.01)
*H01L 23/00* (2006.01)

(52) U.S. Cl.
CPC ............ *H01L 2224/29144* (2013.01); *H01L 2224/29147* (2013.01); *H01L 2224/3003* (2013.01); *H01L 2224/3012* (2013.01); *H01L 2224/30051* (2013.01); *H01L 2224/30505* (2013.01); *H01L 2224/73103* (2013.01); *H01L 2224/73203* (2013.01); *H01L 2224/8309* (2013.01); *H01L 2224/83065* (2013.01); *H01L 2224/83075* (2013.01); *H01L 2224/8389* (2013.01); *H01L 2224/83191* (2013.01); *H01L 2224/83193* (2013.01); *H01L 2224/83203* (2013.01); *H01L 2224/83801* (2013.01); *H01L 2224/83805* (2013.01); *H01L 2224/83862* (2013.01); *H01L 2224/83874* (2013.01); *H01L 2224/83905* (2013.01); *H01L 2224/92* (2013.01); *H01L 2224/94* (2013.01); *H01L 2224/97* (2013.01); *H01L 2924/01322* (2013.01); *H01L 2924/1461* (2013.01)

(56) References Cited

U.S. PATENT DOCUMENTS

| | | | |
|---|---|---|---|
| 7,696,062 B2* | 4/2010 | Chang-Chien | H01L 21/6835 438/455 |
| 7,932,161 B2* | 4/2011 | Apanius | C08F 32/00 257/781 |
| 7,951,647 B2* | 5/2011 | Yang | H01L 21/561 257/E21.001 |
| 2007/0048969 A1* | 3/2007 | Kwon | H01L 21/76898 438/455 |
| 2012/0074554 A1* | 3/2012 | Cheng | B81C 1/00269 257/684 |
| 2013/0260510 A1* | 10/2013 | Theuss | H01L 25/0657 438/109 |

* cited by examiner

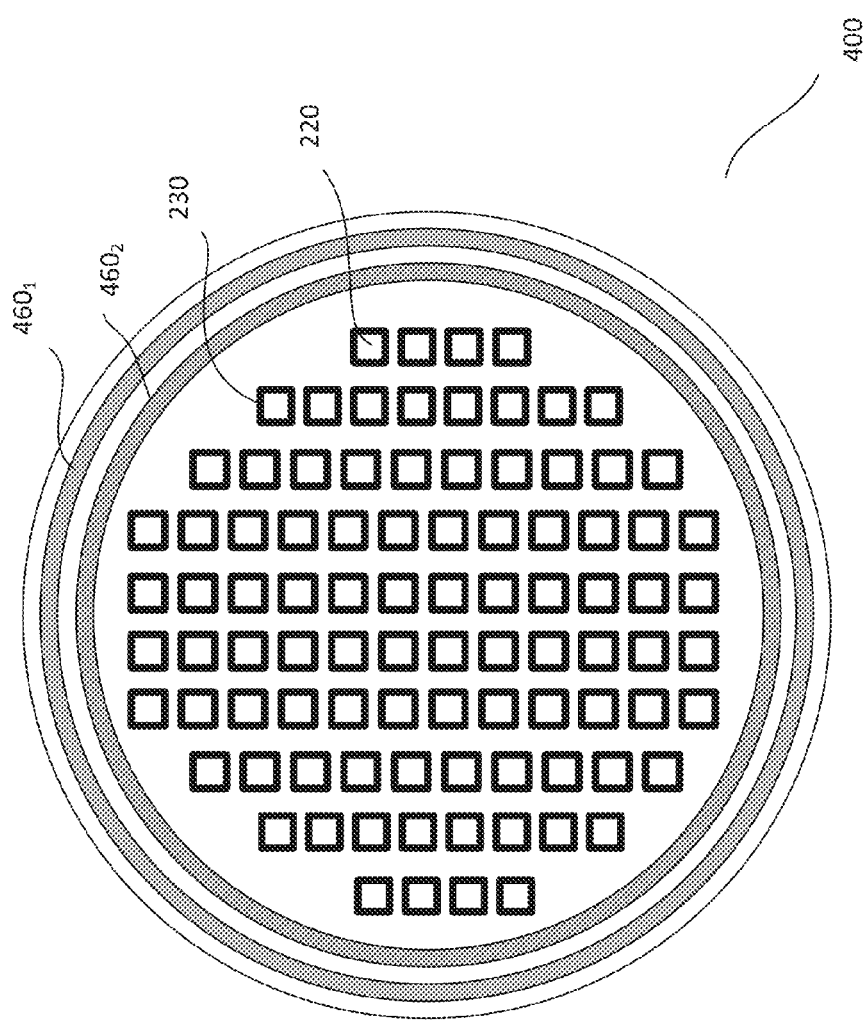

WAFER STACK PROTECTION SEAL

CROSS-REFERENCE TO RELATED APPLICATION

This application claims the priority benefit of U.S. Provisional Application Ser. No. 61/778,465, filed on Mar. 13, 2013, which is herein incorporated by reference in its entirety.

BACKGROUND

Wafer bonding is commonly employed for wafer level 3-D packaging. For example, two wafers are bonded together prior to dicing. After the wafers are bonded to form a wafer stack, the wafer stack is subjected to wafer bumping processing which forms external connections. Conventional wafer bumping processing has been found to cause damage to the wafer stack. For example, chemicals used in wafer bumping processing may damage interconnections between the wafers. Such damages adversely affect reliability and yield.

From the foregoing discussion, it is desirable to provide a wafer stack that avoids damage caused by, for example, wafer bumping processing.

SUMMARY

Embodiments generally relate to semiconductor device and methods for forming semiconductor devices. In an embodiment, a method of forming a semiconductor device is disclosed. The method includes providing first and second wafers with top and bottom surfaces. The wafers include edge and non-edge regions, and the first wafer includes devices formed in the non-edge region. A first protection seal may be formed at the edge region of the first wafer. The first and second wafers may be further bonded to form a device stack. The protection seal in the device stack contacts the first and second wafers to form a seal, and protects the devices in subsequent processing.

In another embodiment, a semiconductor wafer stack is disclosed. The semiconductor wafer stack includes first and second wafers with top and bottom surfaces. The wafers have edge and non-edge regions, and the first wafer includes devices formed in the non-edge region. The semiconductor wafer stack further includes a protection seal disposed at the edge region of the wafer stack in between the first and second wafers. The protection seal in the device stack contacts the first and second wafers and forms a seal protecting the devices in the wafer stack.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 4a-c show simplified plan and side views of alternative embodiments of a semiconductor wafer.

DETAILED DESCRIPTION

Embodiments generally relate to devices and methods for forming devices. The devices may be, for example, semiconductor devices. For example, the semiconductor devices may be integrated circuits. In other embodiments, the devices may be other types of devices, such as micro-electromechanical system (MEMS) devices. In yet other embodiments, the devices may be optoelectronic devices. Embodiments may be employed to form stacked devices, for example, multiple devices stacked together to form a device stack. The device stack may include semiconductor devices. The devices of the stack may be the same type of device. In other embodiments, the device stack may be a combination of different types of devices, for example, IC and MEMS devices stacked together.

The devices may be incorporated into or used with, for example, CMOS products, electronic products, computers, cell phones, and personal digital assistants (PDAs). The devices may also be incorporated into other types of products. In general, the embodiments are further applicable to wafer-to-chip and chip-to-chip bonding, including MEMS, semiconductor IC or other hybrid devices. The embodiments employ a protection seal to protect the edges of a wafer and to minimize or avoid contamination during subsequent processes.

Figure 1A:
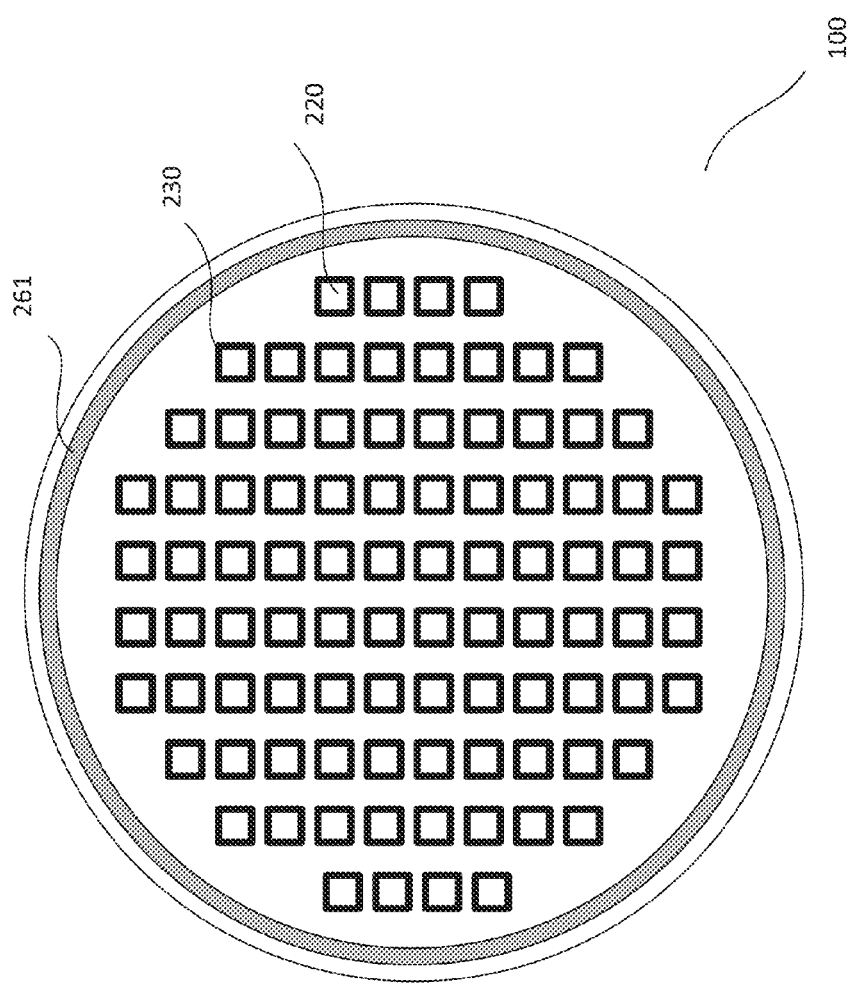
FIGS. 1a-c show plan and side views of various embodiments of a semiconductor wafer.
Figure 1B:
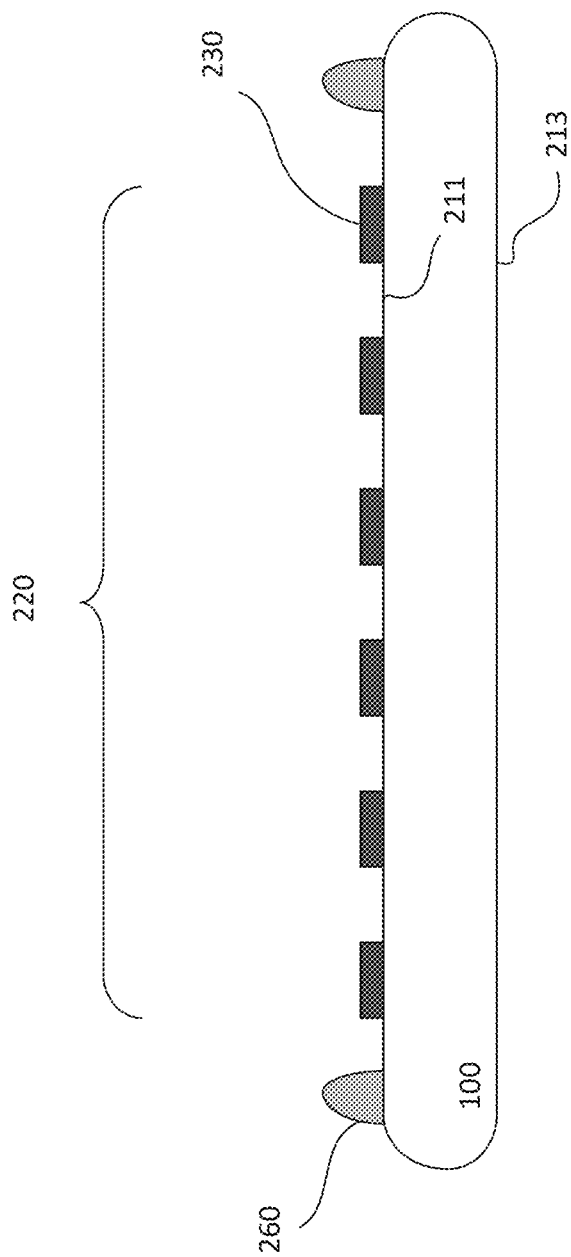
Figure 1C:
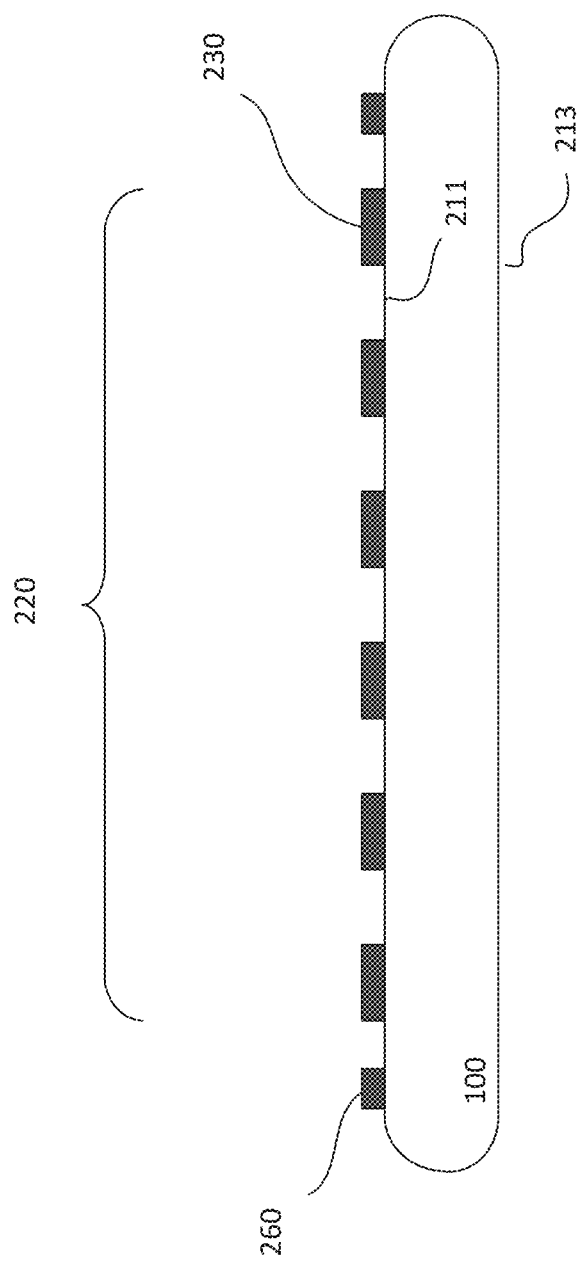

FIG. 1a shows a simplified plan view of an embodiment of a semiconductor wafer 100 while FIGS. 1b-c show corresponding side views of various embodiments of the semiconductor wafer. The semiconductor wafer, for example, may be a silicon wafer. Other types of wafers may also be useful. For example, the wafer may be a germanium (Ge), silicon-germanium alloy (SiGe), silicon-on-insulator (SOI), silicon-on-sapphire (SOS), gallium-arsenic (GaAs) or any other suitable semiconductor materials. The edge of the wafer may be beveled or rounded, as shown. Other types of edges may also be useful. The wafer, as shown, has a circular shape. Depending on the type of device, the wafer may include a notch (not shown) to indicate the crystal orientation of the wafer. Other techniques for indicating the crystal orientation may also be useful. Additional indicators may also be included to indicate the dopant type of the wafer.

The wafer, in one embodiment, is a processed wafer. For example, devices 220 are located on an active surface 211 of the processed wafer. The active surface may be referred to as the top surface while the opposing surface may be the inactive or bottom surface 213. The devices, for example, are formed in parallel. The devices, for example, are arranged in rows along a first (x) direction and columns along a second (y) direction. As shown, full or complete devices are disposed on the active surface. For example, complete devices are disposed in a device or die region on the active surface of the wafer. An edge region surrounds the device region. The edge region may be devoid of devices. In some cases, incomplete devices may be included in the edge region. Incomplete devices are included to, for example, improve processing uniformity. The edge region may have a width of about 1-5 mm. In some instances, the width of the edge region may be uneven. The edge region may have a minimum width of, for example, about 100 um. Other configuration of devices on the wafer may also be useful.

In one embodiment, the wafer is prepared for bonding with another wafer. Bonding two or more wafers together forms a wafer stack. To facilitate wafer stacking, the wafer may include through silicon via (TSV) contacts (not shown). At this stage of processing, the TSV contacts are partially processed. For example, the TSV contacts extend from the active (or top) surface and partially through the wafer. In other words, the bottom of the TSV contacts do not extend through to the inactive (or bottom) surface of the wafer. The top of the TSV contacts at the active surface may be exposed. In other embodiments, the top of the TSV contacts may not be exposed and may be exposed at a later stage of processing.

Additional preparation may include, for example, providing device seals 230. A device seal surrounds a device. The device seals, for example, may be a metal, such as aluminum, copper, gold, tin, their alloys or a combination thereof. Other types of sealing material may also be useful. The device seals may be formed on the wafer to, for example, seal and protect the devices and interconnects on the wafer from environmental conditions of subsequent processing steps. The device seals may be formed by, for example, deposition and photolithography. Other methods for forming the device seals may also be useful. The device seals may be formed on the active surface of the wafer. In other embodiments, the device seals may be formed on a dielectric layer on the active surface of the wafer. The device seals may have a height of about 5 um. Other heights may also be useful. For example, depending on the type of seal used, the device seals may range up to hundreds of microns. The device seals may be provided for devices that are, for example, to be incorporated into or used with sensors. In other embodiments, the device seals may not be necessary.

In one embodiment, a wafer protection seal 260 is disposed on a surface of the wafer. The protection seal is disposed on the mounting surface of the wafer. The mounting surface is the surface on which another wafer is mounted. In one embodiment, the mounting surface is the active surface of the wafer. Providing other mounting surfaces may also be useful. For example, the mounting surface may be the inactive surface of the wafer.

The protection seal, in one embodiment, is formed at the periphery of the wafer. The protection seal is disposed on the edge region outside of the die region. The protection seal may be aligned with a slight gap from the circumferential edge of the wafer. Providing the protection seal in the edge region avoids interfering with the devices. In one embodiment, the protection seal includes a ring structure 261. The ring structure, for example, is a continuous ring structure. The ring, as shown, is circular. Providing a protection seal having other shapes may also be useful. For example, the ring may be a serpentine or zigzag ring. Other suitable patterns may also be useful.

In one embodiment, the protection seal is a pliable protection seal, as shown in FIG. 1b. In one embodiment, the pliable protection seal is a polymeric protection seal. Other types of pliable protection seals may also be useful. Various types of polymers may be used. For example, the polymer may include polyimide, polysulfone, lead (II) oxide (PbO), or benzocyclobutene (BCB). Other types of polymeric materials may also be useful. The pliable seal is disposed on the edge portion of the wafer.

The protection seal has a height that enables sealing of the wafers when bonded. As shown, a height of the protection seal 260 is higher than a height of the device seals 230. In the case where the protection seal is provided on only one of the wafers to be bonded, the height is greater than the final gap between the bonded wafers. The gap between the bonded wafers may be about 5 um. Other gap widths may also be useful. For example, the height of the protection seal may be 10-40% greater than the final gap of the bonded wafers. For the case where protection seals are provided on both wafers, the height of the protection seal may be 10 to 20% greater than half the gap between the bonded wafers. Providing protection seals having other percentages of the gap or half the gap may also be useful. In some instances, the gap width may depend on the technology node. Other configurations of the protection seal 260 which enables sealing between the bonded wafers may also useful. As for the width, it enables sealing of the die region to prevent it from contamination by subsequent processing, such as wafer bumping. The width of the protection seal may be, for example, about 5 um. Other widths may also be useful.

Various techniques may be employed to form the polymer protection seal on the wafer. For example, the polymer seal may be disposed on the edge region of the wafer by dispensing. A dispenser may be used to place the polymer on the edge region of the wafer. Other techniques may include, for example, coating, spraying or brushing and printing. In some implementations, the polymeric protection seal may be formed of a photo-imageable polymer. In such instances, the photo-imageable polymer may be subjected to a lithography process after deposition of the polymer. Other techniques for forming the polymeric protection seal may also be useful.

In another embodiment, as shown in FIG. 1c, the protection seal is formed of a rigid material. In one embodiment, the protection seal is formed of a metal, such as aluminum, copper, gold, tin, their alloys or a combination thereof. Preferably, the protection seal is formed of the same material as the device seals. As shown, the rigid protection seal has the same height as the device seals. A width of the protection seal enables protection of the device region from contamination by subsequent processing. The width of the protection seal, for example, may be about 2 microns. Other widths may also be useful. The protection seal may be formed by, for example, electro-plating, sputtering, evaporations or electroless plating followed by a lithography process. The protection seal may be formed in the same step as patterning the device seals. For example, the sealing material is formed on the wafer surface and patterned to form the device seals and protection seal or seals. Forming the device seals and protection seals in separate processes may also be useful. Other configurations or materials for the protection seal may also be useful. For example, in the case the protection seal is formed of a different material than that of the device seals, separate processes are used to form the device seals and protection seal.

Figure 2A:
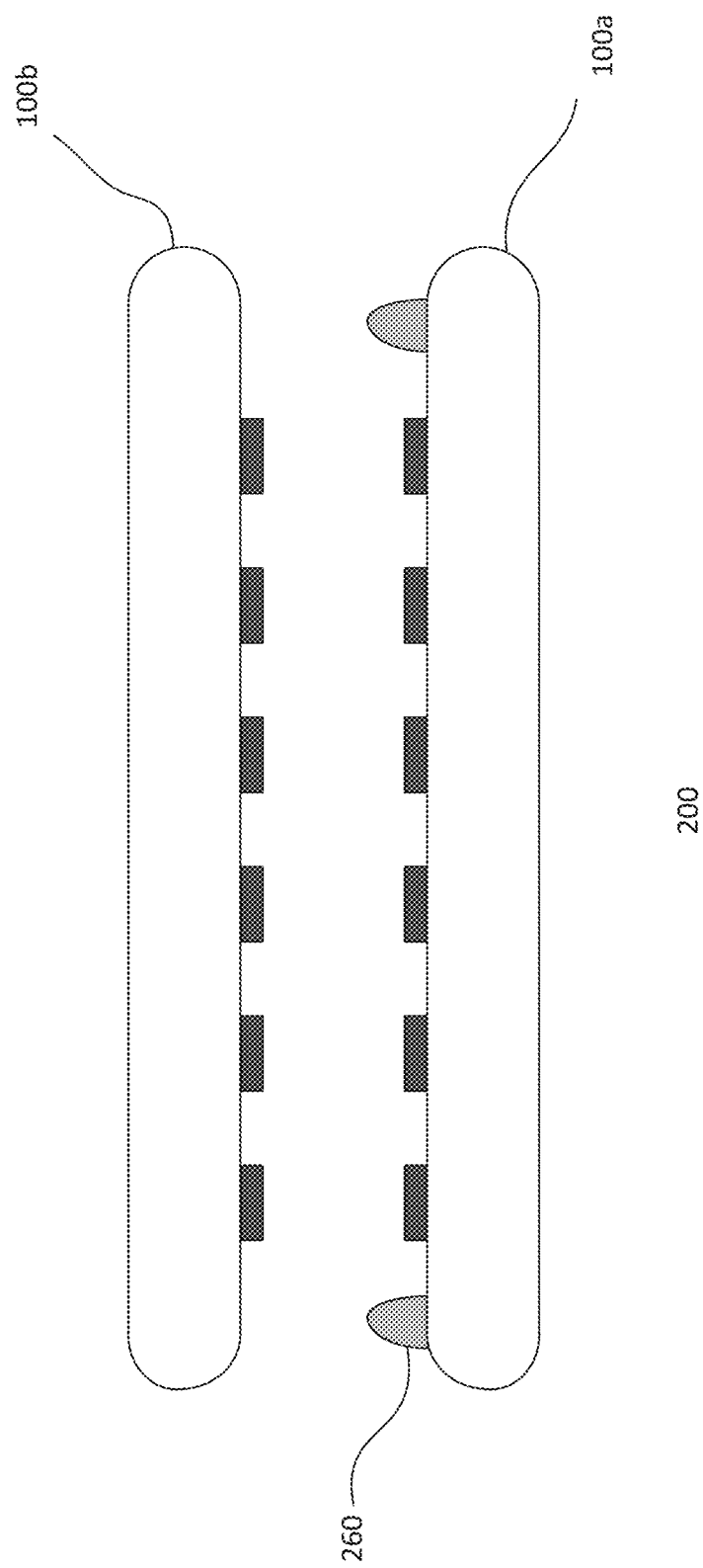
FIGS. 2a-b show an embodiment of a process for stacking wafers.
Figure 2B:
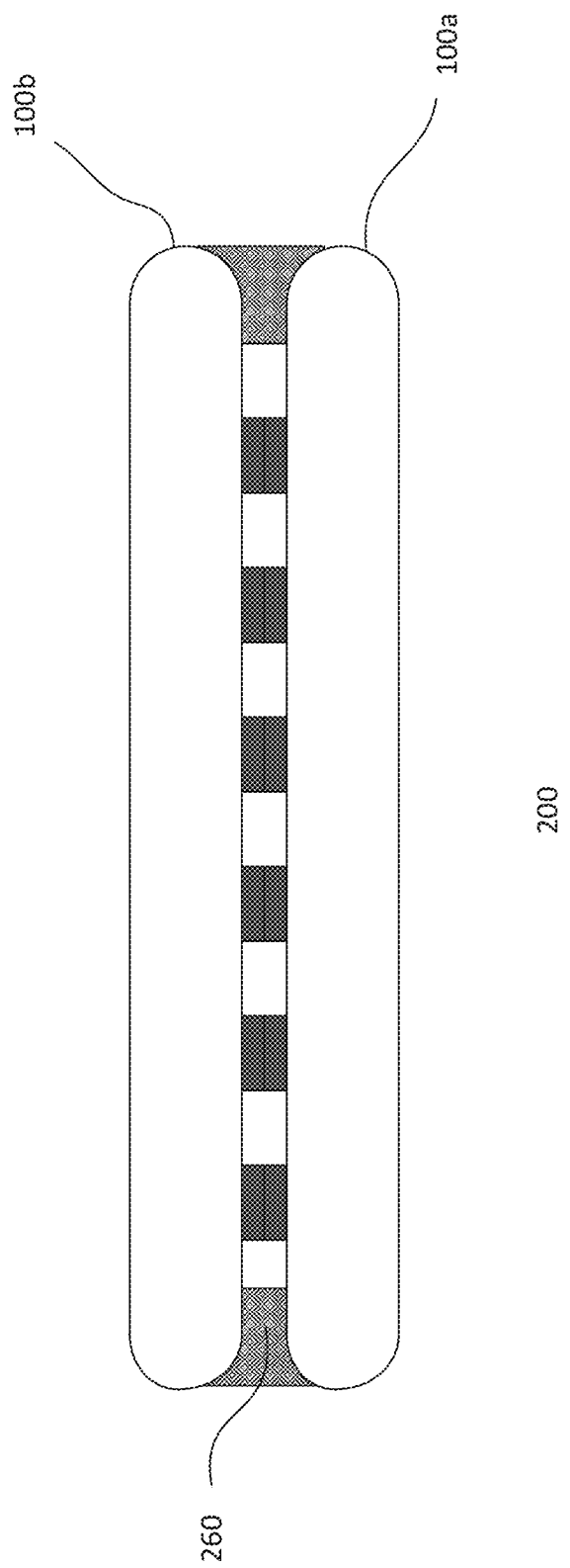

FIGS. 2a-b show an embodiment of a process 200 for stacking wafers. The wafers are similar to those described in FIGS. 1a-c. Common elements may not be described or described in detail.

Referring to FIG. 2a, first and second wafers 100a-b are provided. The wafers are similar to that described in FIGS. 1a-b. For example, one of the wafers includes a protection seal 260 disposed in an edge region of the wafer. In one embodiment, the protection seal is a pliable seal, such as a polymeric seal. The wafer 100a with the protection seal on its edge region may serve as the base wafer. The base wafer may be, for example placed on a stationary plate while the other wafer 100b without a protection seal is moved towards it and pressed against it to form a wafer stack.

In other implementations, both wafers, for example, may have a protection seal disposed on its respective mounting surfaces and pressed together to form the device stack. In such cases, the shapes of the protection seals of the different wafers should be the same to enable mating to each other. In yet other embodiments, protection seals of the different wafers may be different. For example, one may be rigid while the other is a pliable protection seal. The base wafer may have a non-rigid seal while the other wafer has a rigid seal. Providing the base wafer with a rigid seal and the other wafer with a non-rigid seal may also be useful. Similarly, the shapes of the protection seals of the different wafers should be the same to enable mating to each other. Additionally, the non-rigid protection seal has a height to enable bonding with the rigid protection seal.

As described, first and second wafers 100a-b are provided for forming a wafer stack with two wafers. One of the wafers serve as a base wafer. The base wafer, for example, is bottom wafer of the stack. The base wafer includes external contacts for mounting onto a circuit board or a package substrate. The external contacts may be, for example, solder bumps, solder balls or wire bond terminal pads. In one embodiment, at least the base wafer includes TSV contacts. Providing both wafers with TSV vial contacts may also be useful. In some cases, the stack may include n number of wafers, where n is a whole number greater than one. For example, in the case where n is>2, then at least the base and intermediate wafers below the top wafer of the stack include TSV contacts. As shown, the wafers are of the same size. Providing wafers of different sizes may also be useful. For example, one wafer may be slightly smaller than the other wafer.

In FIG. 2b, the first and second wafers are bonded together. One wafer may be fixed while the other is moved into position for bonding. For example, the second wafer is moved into position onto the first (fixed) wafer and bonded. Other configurations of bonding the wafers may also be useful. For example, both wafers may be moved into position. As shown, the active surfaces of the wafers face each other. For example, the device seals of the wafers are aligned for bonding. In other embodiments, the inactive or bottom surface of one wafer may face the active or top surface of another wafer as they are moved into position for bonding. In such cases, the inactive surface of the wafer may be processed to include electrical connections such as wafer bumps, RDL, etc., prior to bonding to the other wafer. Protection seals may also be formed on the inactive surface of the wafer.

The wafers are bonded together. The wafers may be aligned prior to bonding. The wafers may be bonded by bonding processes such as eutectic bonding, thermocompression bonding, solder bonding, glass frit bonding, UV-cured polymer, thermally cured polymer etc. In an embodiment, the wafers may be subjected to first wafer bonding process that bonds the device seals of the wafers. In such instance, the wafers may be bonded in an orientation where the top or active surfaces of the wafers face each other, e.g., wafer top surface-to-top-surface orientation.

The wafer may then be subjected to a second wafer bonding process that bonds the polymeric protection seal on the base wafer to the second wafer. For example, the first wafer bonding process may be eutectic bonding while the second wafer bonding process may be a thermally cured polymer bonding process. The bonding process may include various process conditions such as, for example, temperature, pressure, environment (N2, forming gas, vacuum, etc.). Other methods for bonding the wafers may also be useful. For example, the wafers may be bonded in an orientation where the top or active surface of the first wafer faces the bottom or inactive surface of the second wafer, e.g., wafer top surface-to-bottom-surface orientation. In such orientation, the second wafer may be processed to include electrical connections such as, for example, contacts, RDL, etc., on its bottom surface. In some instances, the second wafer may be a capping wafer that may be a blank wafer that may be removed at later stages of processing.

The bonding process causes the protection seal on the first wafer to contact the second wafer and form a seal. For example, the protection seal fills the gap between the first and second wafers when positioned for bonding. The protection seal is compressed and expands laterally. In one embodiment, the protection seal extends outward to cover at least partially edges of the wafers. This advantageously forms a hermetic seal at the edge region of the wafer stack that protects the device seals and reduces or prevents damage to wafer edge from the bonding and subsequent processing.

In one embodiment, subsequent processing includes back grinding at least the base wafer to expose the bottom of the TSV contacts. A redistribution layer (RDL) may be formed over the inactive wafer surface. The RDL include conductive traces on an isolation layer and is covered by a passivation layer. Openings are provided in the RDL in which bumps are formed. This provides external connections to the device on the active side through the TSV contacts and RDL. Under Bump metallization may be employed to provide adhesion layer to the RDL and other layers such as a barrier layer, wettable layer, etc., in order to facilitate a subsequent bumping process.

The protection seal, as described, protects the devices in the device region from contamination due to the bumping process. Additionally, in the case of a pliable protection seal, the wafer edges are protected from damage during bumping process handling.

Figure 3A:
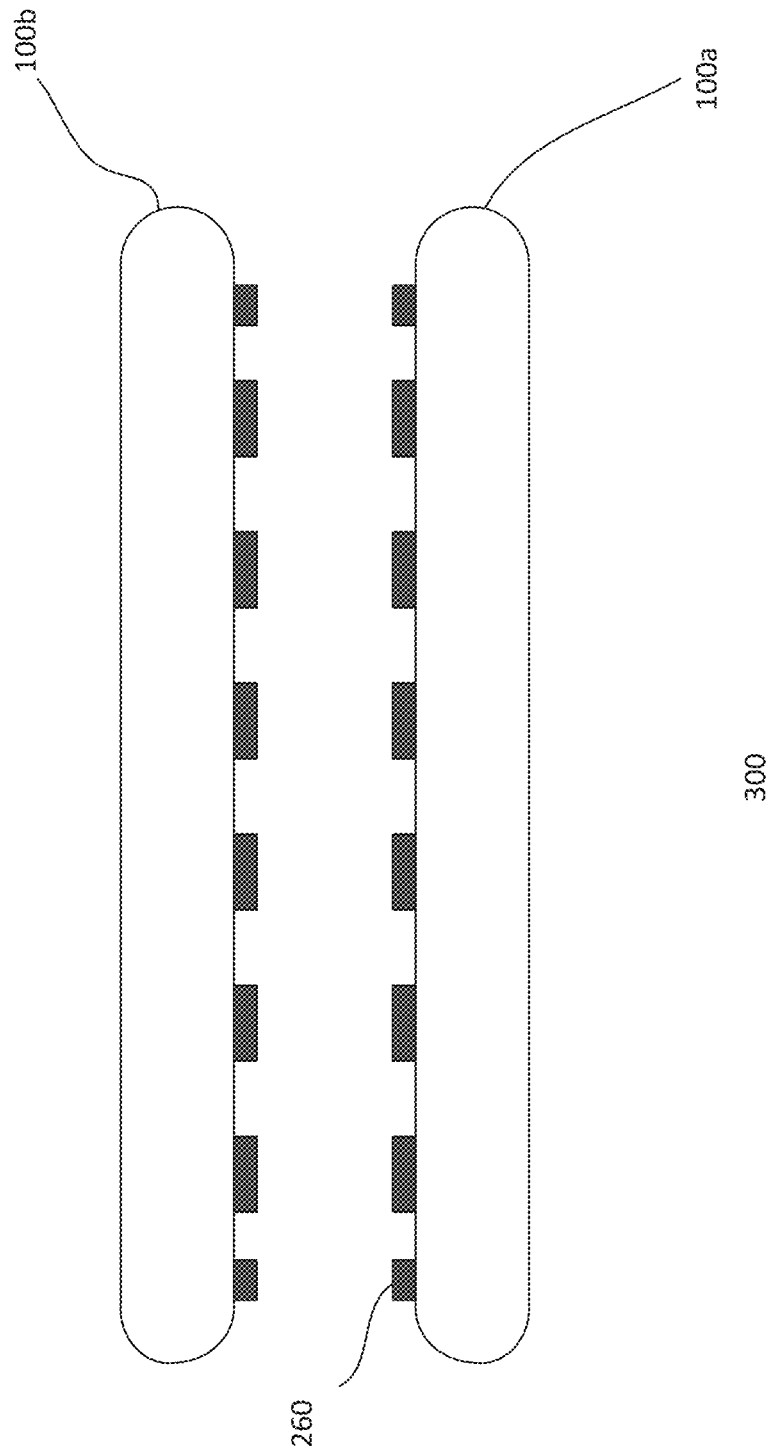
FIGS. 3a-b show another embodiment of a process for stacking wafers.
Figure 3B:
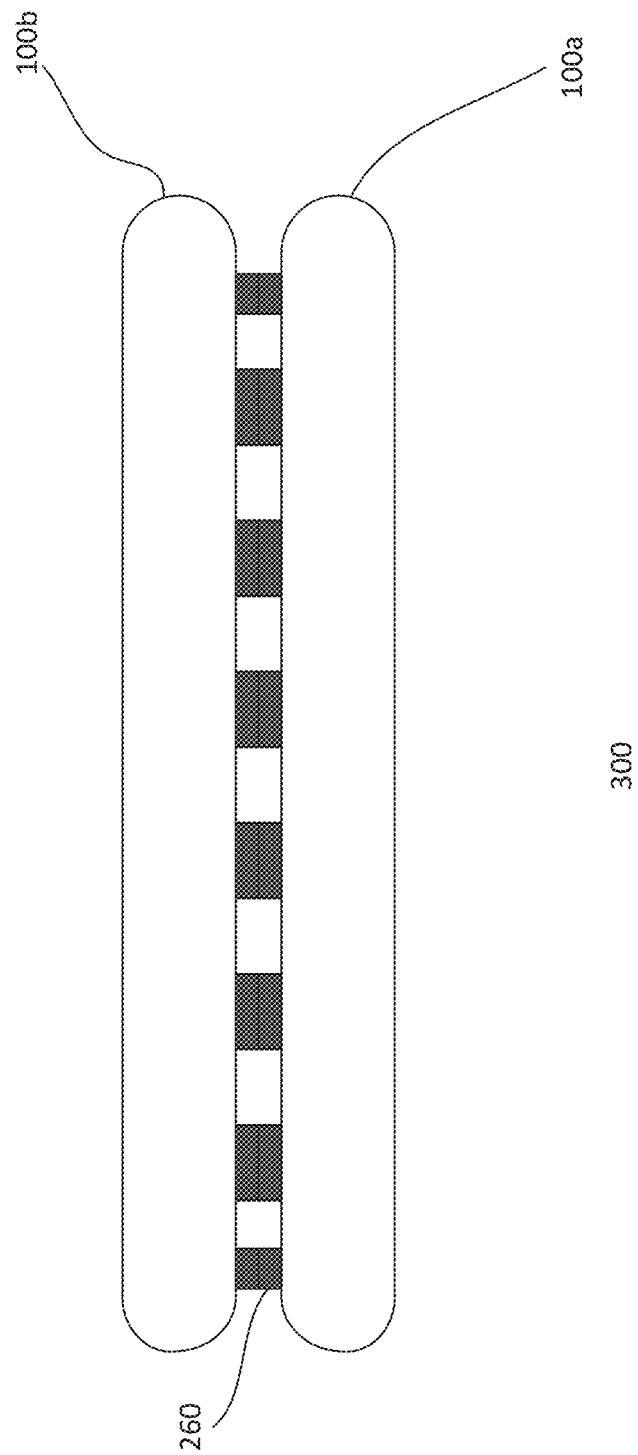

FIGS. 3a-b show another embodiment of a process 300 for stacking wafers. The process and wafers are similar to those described in FIGS. 1a-c and FIGS. 2a-b. Common elements may not be described or described in detail.

Referring to FIG. 3a, first and second wafers 100a-b are provided. The wafers are similar to those described in FIGS. 1a and 1c. For example, both the wafers includes a rigid protection seal 260 disposed in an edge region. In one embodiment, the rigid protection seal is a metal protection seal. The protection seal, for example, may be formed of a metal, such as aluminum, copper, gold, tin, their alloys or a combination thereof. Preferably, the protection seal is formed of the same material as the device seals. Providing a protection seal which is not the same material as the device seals may also be useful.

As shown in FIG. 3b, the first and second wafers are bonded together. The wafers are bonded together by, for example, eutectic bonding. In some embodiments, the wafers may be bonded by thermocompression bonding. Other methods for bonding the wafers may also be useful. In an embodiment where the protection seal and device seals are formed of the same material, the bonding process may be performed in the same step, i.e. single step, with the same process conditions (for example same temperature, pressure, etc). In other embodiments, where the protection seal and device seals are formed of different materials, the bonding process may include more than one step with different process conditions. For example, the device seals may be bonded in a first wafer bonding process followed by a second wafer bonding process to bond the protection seals on both wafers. The bonding process causes the protection seals on the first and second wafers to form a seal or a protection barrier.

Similar to the bonding process as described in FIGS. 2a-b, the wafers may be bonded in an orientation where the top or active surfaces of the wafers face each other, e.g., wafer top surface-to-top-surface orientation. In other embodiments, the wafers may be bonded in an orientation where the top or active surface of the first wafer faces the bottom or inactive surface of the second wafer, e.g., wafer top surface-to-bottom-surface orientation. In such orientation, the second wafer may be processed to include electrical connections such as, for example, contacts, RDL, etc., on its bottom surface. Additionally, protection seal may be formed on the bottom surface of the second wafer instead of the top surface.

After bonding, the wafer stack is subjected to subsequent processing. For example, subsequent processing includes back grinding at least the base wafer to expose the bottom of the TSV contacts. A redistribution layer (RDL) may be formed over the inactive wafer surface. The RDL include conductive traces on an isolation layer and is covered by a passivation layer. Openings are provided in the RDL in which bumps are formed. This provides external connections to the device on the active side through the TSV contacts and RDL. The protection seal, as described, protects the devices in the device region from contamination due to the bumping process.

In alternative embodiments, a wafer may be provided with n protection seals, where n is a whole number≥1. As described in FIGS. 1a-c, FIGS. 2a-b and FIGS. 3a-b, a wafer is provided with 1 protection seal (n=1). Providing a plurality of protection seals is also useful.

Figure 4B:
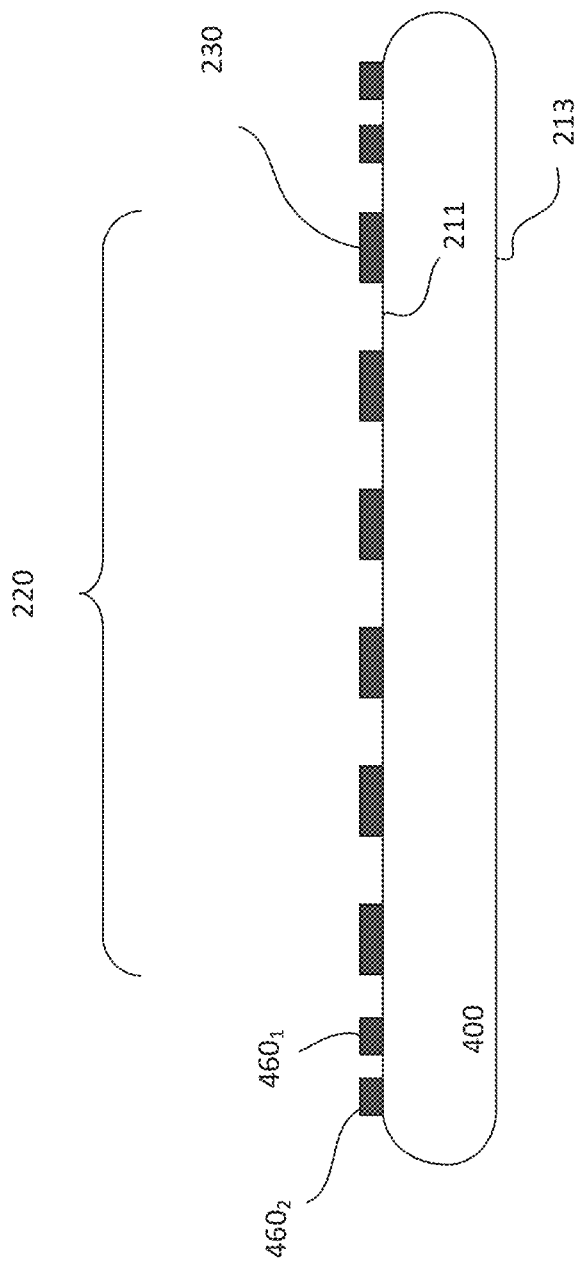
Figure 4C:
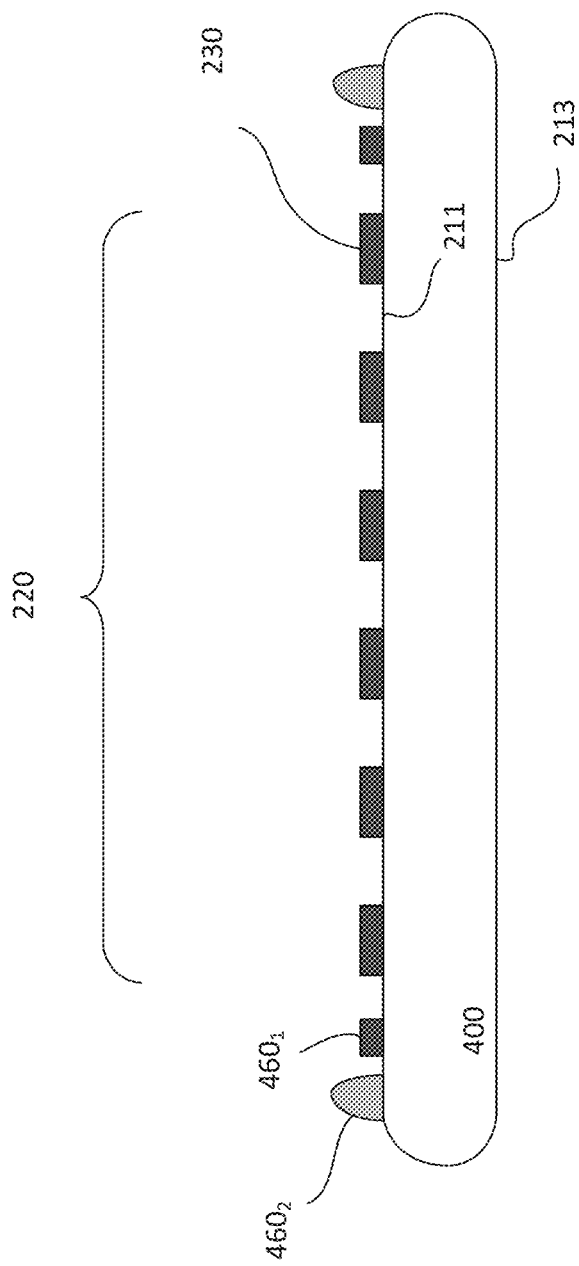

FIG. 4a shows a simplified plan view of alternative embodiment of a semiconductor wafer 400 while FIGS. 4b-c show corresponding side views of various embodiments of the semiconductor wafer. The wafer shown is similar to those described in FIGS. 1a-c. Common elements may not be described or described in detail.

The semiconductor wafer 400, for example, may be a silicon wafer. Other types of wafers may also be useful. The wafer, in one embodiment, is a processed wafer. For example, devices 220 are disposed on device region of an active surface 211 of the processed wafer. In one embodiment, the wafer is prepared for bonding with another wafer. For example, the wafer is prepared with TSV contacts (not shown) and device seals 230. A device seal surrounds a device. The device seals, for example, may be a metal, such as aluminum, copper, gold, tin, their alloys or a combination thereof. Other types of sealing material may also be useful.

As shown, wafer protection seals 460 are disposed on a surface of the wafer. The protection seal is disposed on the mounting surface of the wafer. The mounting surface is the surface on which another wafer is mounted. In one embodiment, the mounting surface is the active surface of the wafer. Providing other mounting surfaces may also be useful. For example, the mounting surface may be the inactive surface.

Protection seals 460, in one embodiment, are formed at the periphery of the wafer. The protection seals are disposed on the edge region outside of the die region. As shown, first and second protection seals $460_{1-2}$ (e.g., n=2) are provided in the edge region of the wafer. Providing other number of protection seals may also be useful (e.g., any n which is≥1 or>2). The protection seals, as shown, are concentric ring shaped seals disposed in the edge region. The protection seals may have a circular shape. Alternatively, the concentric seals may have other ring shapes. Although the seals are described having the same shape, providing seals having different shapes may also be useful. Also, different seals may have different shapes.

In one embodiment, as shown in FIG. 4b, the protection seals are homogenous protection seals. For example, the protection seals 460 are rigid protection seals. The rigid protection seal are formed of, for example, a metal, such as aluminum, copper, gold, tin, their alloys or a combination thereof. Preferably, the protection seals 460 are formed of the same material as the device seals 230. As shown, the rigid protection seals 460 have the same height as the device seals 230. Preferably, the protection seals 460 are the same as the device seals. Providing protection seals which are different from the device seals is also useful. Providing protection seals which is a combination of the same and different material as the device seals is also useful. Other configurations of protection seals 460 are also useful. For example, the protection seals may be non-rigid protection seals, such as polymer protection seals.

In another embodiment, as shown in FIG. 4c, the protection seals 460 are hybrid protection seals. For example, the protection seals 460 include rigid and non-rigid or pliable protection seals. The rigid seal may be a metal and the pliable seal may be a polymer. Other rigid and pliable seals may also be useful. In one embodiment, the hybrid seal configuration includes a pliable seal for the outermost seal. As for the inner seal, it is a rigid seal. In the case where n is>2, the inner seals are rigid seals. Other configurations of seals may also be useful. For example, the outer seal may be rigid and the inner may be pliable. Additionally, the seals of the different wafers of the stack need not be the same type. However, they should have same or similar shapes for mating.

The wafers described in FIGS. 4a-c can be bonded as described in FIGS. 2a-b and 3a-b. In addition, subsequent processing on the wafer stack may be included. Such processing, for example, includes back grinding at least the base wafer to expose the TSV contacts, RDL and bumping.

The exemplary devices and methods may be employed in wafer level bonding to form a wafer stack with multiple wafers. In some cases, each wafer may be stacked in the same orientation where the top surface of one wafer faces the bottom surface of another wafer. For instance, the mounting surfaces may be a top surface of a wafer and a bottom surface of another wafer. In such instances, the bottom surface of the wafer may include a protection seal as well as electrical connections. In other cases, each wafer may be stacked in a different orientation. For example, the mounting surfaces may include the top and bottom surfaces of a wafer. Protection seals may be formed on both top and bottom surfaces of a wafer prior to bonding. The wafers of the wafer stack may have the same number or different number of protection seals. For example, the first and second bonded wafers at the base of the wafer stack may have two protection seals at the periphery of the wafers while the subsequent third and fourth bonded wafers of that wafer stack may have only one protection seal at the periphery of the wafers. Other configurations may also be useful. For example, the protection seals may be homogenous or hybrid of protection seals.

Further, although the embodiments of the present disclosure are employed at the current 300 mm technology node, the embodiments may be extended to include other technology nodes, including any future nodes such as, for example, 450 mm, 600 mm, etc.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a semiconductor device comprising:

providing first and second wafers with top and bottom surfaces, the wafers include edge and non-edge regions, wherein the first wafer includes devices formed in the non-edge region;

forming a first protection seal at the edge region of the first wafer, wherein the protection seal is formed by depositing a polymer material on the top surface of the first wafer to a height about 10-40% greater than a final gap between the first and second wafers when bonded; and bonding the first and second wafers to form a device stack, wherein the polymer material on the first wafer contacts the second wafer and is compressed by the first and second wafers, the polymer material expands laterally to cover at least partially edges of the wafers and form a bonded wafer protection seal, the bonded wafer protection seal protects the devices in subsequent processing.

2. The method of claim 1 wherein the protection seal is formed of pliable material.

3. The method of claim 1 wherein the protection seal is formed of polyimide, polysulfone, lead (II) oxide (PbO), or benzocyclobutene (BCB).

4. The method of claim 1 wherein the protection seal is formed by dispensing.

5. The method of claim 1 further comprising forming a second protection seal at the edge region of the second wafer.

6. The method of claim 5 wherein the protection seals are formed on the top surfaces of the first and second wafers.

7. The method of claim 5 wherein the first protection seal is formed on the top surface of the first wafer while the second protection seal is formed on bottom surface of the second wafer.

8. The method of claim 1 further comprising forming a second protection seal at the edge region of the first wafer, wherein the first protection seal is an outer seal and the second protection seal is an inner seal.

9. The method of claim 8 wherein the second protection seal is formed of a metallic material.

10. The method of claim 9 wherein bonding the first and second wafers comprises first and second wafer bonding processes, the first bonding process includes thermocompression bonding and the second wafer bonding process includes thermally cured polymer bonding.

11. A method of forming a semiconductor device comprising:

providing first and second wafers with top and bottom surfaces, the wafers include edge and non-edge regions, wherein the first wafer includes devices formed in the non-edge region;

forming device seals that surround the devices in the non-edge region of the first wafer;

forming a first protection seal ring at the edge region of the first wafer such that the first protection seal ring surrounds the devices and device seals in the non-edge region, wherein the device seals and the first protection seal ring are formed on the top surface of the first wafer in the same deposition process step, the deposition process comprises forming a sealing material on the top surface of the first wafer, and patterning the sealing material to form the device seals which surround the devices at the non-edge region of the first wafer, and the first protection seal ring at the edge region which surrounds the devices and device seals in the non-edge region;

forming a second protection seal ring at the edge region of the second wafer;

bonding the first and second wafers to form a device stack, wherein the first protection seal ring on the first wafer contacts the second protection seal ring on the second wafer to form a bonded wafer seal ring, the bonded wafer seal ring protects the devices in subsequent processing.

12. The method of claim 11 wherein the sealing material of the protection seal and the device seals is a metallic material.

13. The method of claim 12 further comprising:

forming device seals on the second wafer, and wherein bonding the first and second wafers comprises a bonding process that bonds the device seals and protection seals of the first and second wafers in the same bonding process step.

14. The method of claim 13 further comprising providing multiple wafers and bonding the wafers to form a device stack, wherein the first protection seal is formed on the top surface of the first wafer, and other protection seals are formed on the top and/or bottom surfaces of the other wafers.

15. The method of claim 12 wherein the protection seal is formed of copper, gold, tin, their alloys or a combination thereof.

16. The method of claim 11 wherein the device seals and the first protection seal ring are formed to the same height on the top surface of the first wafer in the same deposition process step.

17. The method of claim 1 wherein the first and second wafers comprise the same size.

18. The method of claim 12 further comprising forming a third protection seal ring at the edge region of the first wafer, wherein the first protection seal ring is an inner seal ring and the third protection seal ring is an outer seal ring.

19. The method of claim 18 wherein the third protection seal ring is formed of a polymer material.

20. The method of claim 19 further comprising:

forming a fourth protection seal ring at the edge region of the second wafer, wherein the second protection seal ring is an inner seal and the fourth protection seal ring is an outer seal; and wherein the third protection seal ring on the first wafer contacts the fourth protection seal ring on the second wafer to form a second bonded wafer seal ring during the bonding process, the second bonded wafer seal ring protects the devices in subsequent processing.

* * * * *